United States Patent [19]
Permuy

[11] Patent Number: 6,031,306
[45] Date of Patent: *Feb. 29, 2000

[54] ELECTRIC MOTOR INCORPORATING ITS OWN ELECTRONIC CONTROL

[75] Inventor: Alfred Permuy, Rueil Malmaison, France

[73] Assignee: Valeo Electronique, Creteil, Cedex, France

[*] Notice: This patent issued on a continued prosecution application filed under 37 CFR 1.53(d), and is subject to the twenty year patent term provisions of 35 U.S.C. 154(a)(2).

[21] Appl. No.: 08/936,880

[22] Filed: Sep. 25, 1997

[30] Foreign Application Priority Data

Sep. 26, 1996 [FR] France ................... 96 11743

[51] Int. Cl.⁷ .............. H02K 7/00; H02K 9/00; H02K 1/32; H02K 5/00
[52] U.S. Cl. .............. 310/67 R; 310/64; 310/89; 310/62; 310/63; 310/60 A; 310/68 D
[58] Field of Search ........... 310/64, 67 R, 310/89, 88, 87, 59, 60 R, 62, 63, 60 A, 68 D, 66, 68 R, 68 B, 68 C

[56] References Cited

U.S. PATENT DOCUMENTS

| | | | |
|---|---|---|---|
| 3,707,037 | 12/1972 | Gutris | 29/596 |
| 3,809,935 | 5/1974 | Kristen et al. | 310/68 |
| 4,554,473 | 11/1985 | Muller | 310/67 R |
| 4,840,222 | 6/1989 | Lakin et al. | 165/47 |
| 5,006,744 | 4/1991 | Archer et al. | 310/89 |
| 5,038,088 | 8/1991 | Arends et al. | 318/565 |
| 5,043,614 | 8/1991 | Yockey | 310/68 D |
| 5,049,769 | 9/1991 | Reinhardt et al. | 310/64 |
| 5,610,456 | 3/1997 | Wille et al. | 310/58 |
| 5,640,062 | 6/1997 | Yockey | 310/68 D |
| 5,892,308 | 4/1999 | Abadia et al. | 310/68 D |

FOREIGN PATENT DOCUMENTS

| | | |
|---|---|---|
| 715 396 | 6/1996 | European Pat. Off. . |
| 2 028 006 | 2/1980 | United Kingdom . |

OTHER PUBLICATIONS

French Search Report dated Jun. 6, 1997.

*Primary Examiner*—Elvin Enad
*Assistant Examiner*—Dang Dinh Le
*Attorney, Agent, or Firm*—Morgan & Finnegan LLP

[57] ABSTRACT

In an electric motor which includes an electronic control device and an armature within a closed motor casing, the electronic control device is arranged within the casing, in a position offset axially from but close to the armature. The motor includes a thermal screen which is interposed axially between the armature and the control device, and the screen includes means for dissipating heat outside the casing.

17 Claims, 2 Drawing Sheets

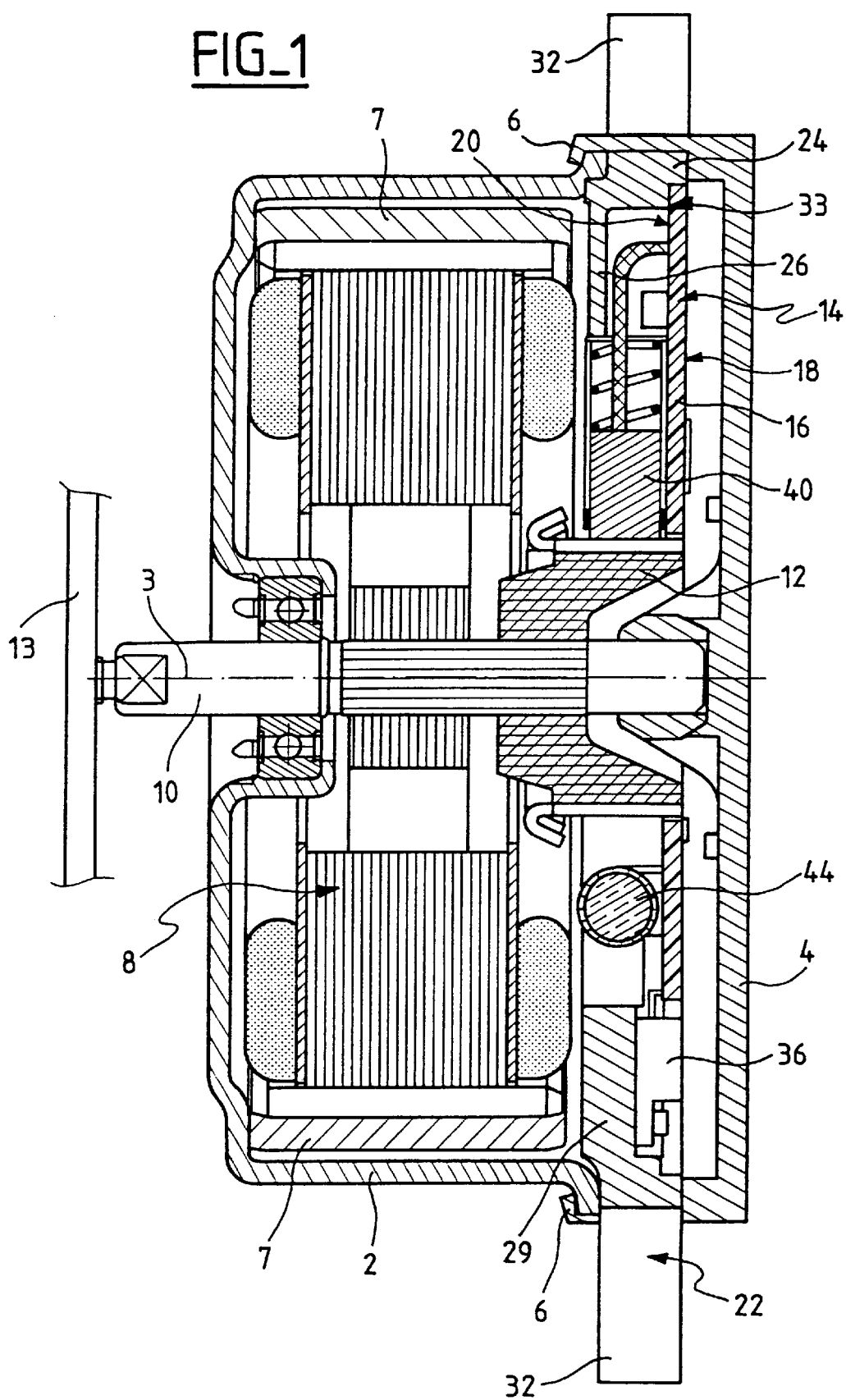

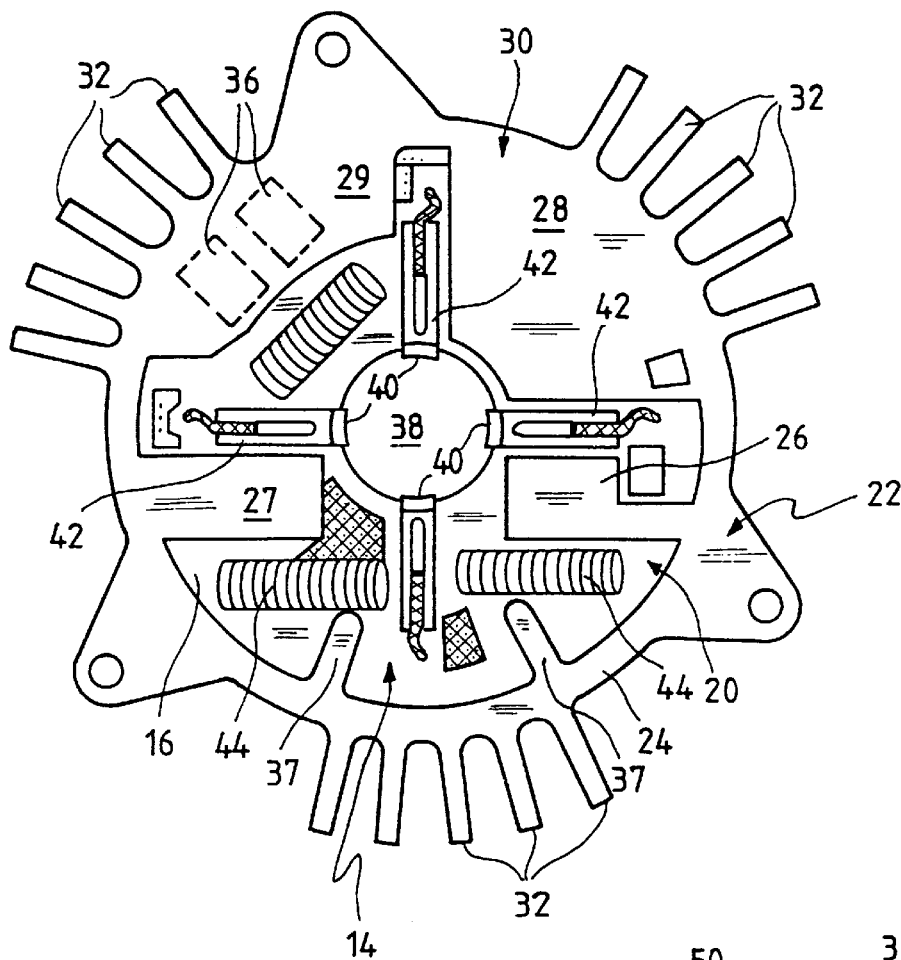
FIG_2
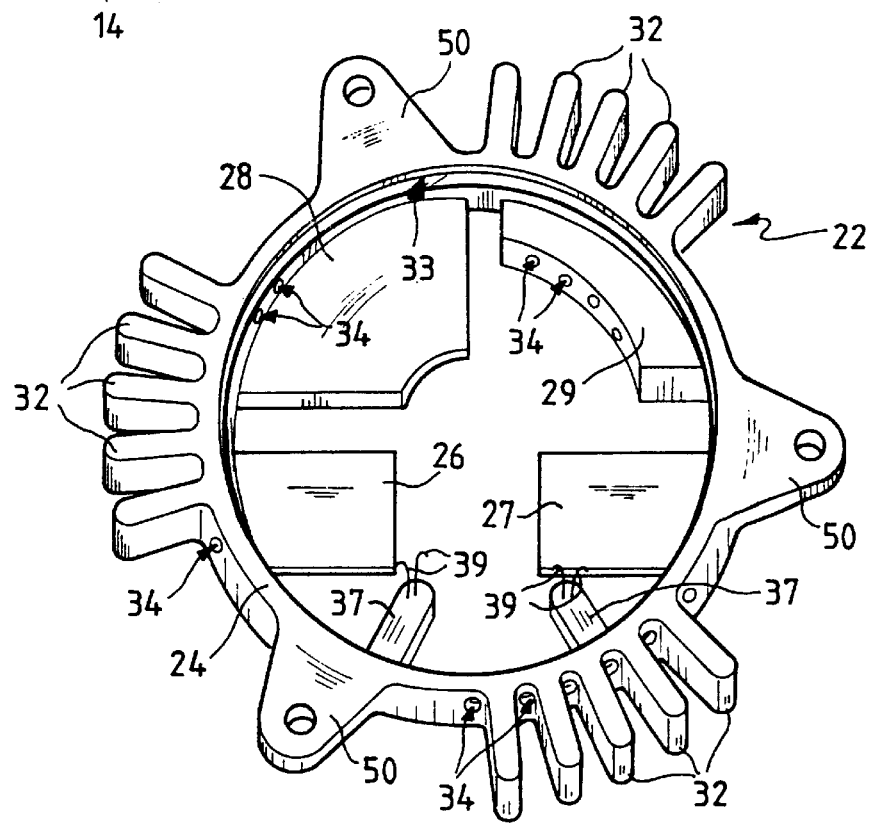
FIG_3 ated at the periphery of the motor to be left free. This space

ELECTRIC MOTOR INCORPORATING ITS OWN ELECTRONIC CONTROL

FIELD OF THE INVENTION

This invention relates to electronically controlled electric motors in which the electronic control means is integrated, i.e. incorporated, within the electric motor. In particular the invention relates to motorized fans for motor vehicles.

BACKGROUND OF THE INVENTION

European patent No. EP 0 71 5 396 discloses a motorized fan for a motor vehicle, incorporating its own electronic control means and comprising a closed cylindrical casing, an armature contained within the casing, a housing arranged as an axial extension of the armature, and an electronic device for controlling the motor, contained within this housing. The location of the electronic control means is close to the motor, which enables long connecting wires to be dispensed with, and therefore reduces the effects of electromagnetic disturbance. The location of the control housing as an axial extension of the motor casing enables the whole of the radial peripheral space around the motor to be left free. This space contains the blades of the fan driven by the motor, and the stream of air impelled by the fan passes axially through this free space, and therefore flows over the motor casing. The control housing is separated from the motor casing by a layer of air. The electronic logic and power components arranged within the housing, some of which are vulnerable to high temperatures, are therefore largely insulated from the heat given off by the motor. The above mentioned layer of air is favorable to the evacuation of the heat given off by the motor and by the electronic components.

However, this structure comprising a casing and a housing, separated from each other in the axial direction by a layer of air, does require a large amount of space to be provided in the axial direction. In this connection, at the present time there is an increasing demand for axially compact motorized fans for motor vehicles.

DISCUSSION OF THE INVENTION

One object of the invention is to provide a motor which defines at the periphery of the motor a free space identical to that in the motors of the prior art discussed above, but having a reduced axial size as compared with such prior art motors.

With a view to achieving this object, according to the invention, there is provided an electric motor incorporating electronic control means, the motor comprising a closed casing, an armature contained within the casing, and an electronic control device disposed in a position which is effectively an axial extension of the position occupied by the armature, wherein the electronic control device is contained within the casing, and the motor includes a thermal screen which is interposed axially between the armature and the control device, the screen including means for dissipating heat to the outside of the casing.

Thus, the thermal screen forms an obstacle to heat transfer between the armature and the electronic control device. The screen captures and dissipates the heat given off by the armature and by the control device. The disposition of the thermal screen and the control device within the casing enables the axial length of the motor to be reduced, while the radial dimensions of the latter are not increased.

Preferably, the thermal screen is discontinuous, so that it defines a passage for air to pass between the armature and the electronic control device. It thus, becomes possible to give thermal protection to the most heat-sensitive parts of the electronic control device. This discontinuity of the screen keeps the weight of the screen down, and therefore, reduces the weight of the unit as a whole.

According to a preferred feature of the invention, the screen comprises at least one flat metallic panel which is disposed at right angles to the axis of the armature (i.e. the motor axis), and which is interposed between the armature and the electronic control device.

The control device preferably includes at least one power component arranged in thermal contact with a panel of the thermal screen. In this way, the screen directly receives the heat given off by that component.

According to another preferred feature of the invention, the means for dissipating heat comprise cooling fins projecting outside the casing. These fins are thus, cooled by the air outside the casing, and this cooling effect is particularly effective in the case of a motorized fan generating a stream of air around the immediate periphery of the motor.

According to a further preferred feature of the invention, the means for dissipating heat include ducts which extend within a thickness of the thermal screen, each duct having a first end open within the motor casing, and a second end open on the outside of the casing. This enables air flow to be generated between the outside and the inside of the motor, enabling hot air to be evacuated from the interior of the motor, and contributing to the dissipation of the heat taken up by the screen.

Further features and advantages of the invention will appear more clearly on a reading of the following detailed description of a preferred embodiment of the invention, which is given by way of non-limiting example only and with reference to the accompanying drawings.

BRIEF DESCRIPTION OF THE DRAWINGS

FIG. 1 is an axial cross sectional view of a motor in accordance with the invention.

FIG. 2 is a plan view of the screen and the printed circuit board, showing the side of the screen and the side of the facing the armature.

FIG. 3 is a perspective view of the screen of the motor of FIG. 1, showing the side of the screen facing the end plate of the motor.

DESCRIPTION OF A PREFERRED EMBODIMENT OF THE INVENTION

The electric motor shown in FIG. 1 is a motorized fan for a motor vehicle. It comprises a cylindrical casing shell 2 having an axis 3. The shell 2 has a first axial end, or front end (on the left hand side in FIG. 1) and a second axial end or rear end, on the right hand side of FIG. 1. The casing shell 2 includes a base portion closing the first axial end, while the second axial end is open. An essentially flat cover plate 4 lies at right angles to the motor axis 3 and closes the rear end of the casing shell 2. The casing shell 2 and the end plate 4 are of metal, and constitute a closed cylindrical casing of the motor. The end plate 4 has a set of lugs 6 for fastening the end plate over one end of the body shell 2 by clipping.

The motor has an inductor consisting of permanent field magnets 7, and an armature 8 including an armature shaft or motor shaft 10 on the axis 3, the field magnets and the armature being contained within the casing. The motor shaft 10 carries a commutator 12. The motor also includes a fan rotor 13, or helix, only the hub of which has been shown (and only partly shown) in FIG. 1. The fan rotor 13 is secured on one end of the motor shaft 10 projecting through the base of the body shell 2. The fan rotor includes fan blades (not shown) which project in a manner known per se beyond the periphery of the motor casing, and generate, around the motor, a stream of air which is oriented in the axial direction from front to rear (that is to say from left to right in FIG. 1).

The motor incorporates an electronic control device 14 for controlling the motor. The control device 14 is mounted in a position offset axially, but juxtaposed, with respect to the armature 8, and is mounted within the motor casing adjacent to the end plate 4. Thus the position of the device 14 effectively constitutes an axial extension of the position in which the armature is mounted.

This control device includes a printed circuit board 16 which lies at right angles to the axis 3 and which has a rear face 18 facing towards the end plate 4. The printed circuit board 16 carries the electronic components which constitute a circuit for determining and controlling the power supply voltage to the motor (and therefore its speed of rotation), within a range of values between zero voltage and the nominal voltage of the motor. This determination is made as a function of a datum value such as a value of temperature within the engine compartment of the vehicle in which the motor is fitted. The electronic components are fixed on a front face 20 of the printed circuit board 16 which lies on the same side of the latter as the armature 8, as shown in FIG. 2.

The motor also includes a thermal screen 22, which is generally flat and which lies at right angles to the axis 3, being interposed axially between the armature 8 and the electronic control device 14. The thermal screen 22 is in the form of a single cast metal component, and is for example made of aluminum. It has a circular frame or hoop portion 24 which is centred on the axis 3, and which is interposed axially between the casing shell 2 and the end plate 4 of the casing. The hoop portion 24 bears at the front, i.e towards the armature 8, against the edge of the casing shell 2, while its rear side bears against a shoulder of the end plate 4.

The thermal screen 22 includes four flat metallic panels 26, 27, 28 and 29, lying at right angles to the axis 3 and extending from the hoop portion 24 inwardly of the hoop portion and the motor casing. These panels are interposed axially between the armature 8 and the control device 14, as can be seen in FIG. 1. The two panels 26 and 27 are generally rectangular in form, while the form of the other two panels 28 and 29 is generally that of a sector of an annulus. The four panels are distributed, as can be seen in FIG. 2, about the axis 3 in the four quadrants defined by the circular hoop portion 24. They together define, in the centre of the thermal screen, a free space which is occupied by the commutator 12. The thickness of the three panels 26, 27 and 28 is small by comparison with that of the hoop portion 24. These three panels lie adjacent to a front face 30 of the hoop portion 24, facing towards the armature 8. The panel 29 is much thicker than the other two panels. All four panels are substantially coplanar with each other, and are spaced apart as best seen in FIG. 3, so that the thermal screen 22 is discontinuous when seen in end view. The screen thus provides an air passage between the armature 8 and the electronic control device 14.

The thermal screen 22 also includes straight cooling fins 32 which extend at right angles to the axis 3 and project away from the motor casing from the hoop portion 24 of the screen. In this example there are fifteen of these cooling fins 32, divided into three sets of five fins each, which are disposed on the periphery of the hoop portion or frame 24, with each set being spaced from the others by about 120 degrees.

The thermal screen 22 is formed with a set of radial ducts 34 of circular cross section, which extend within a thickness of the screen; in particular, they extend through the hoop portion 24. Each duct 34 has a first or inner end which is open inside the motor casing and hoop portion 24, and a second or outer end which is open on the outside of the casing and of the hoop portion. Sixteen of these radial ducts are provided. Four of these extend through the hoop portion 24 and the panel 29, within the thickness of the latter. The other twelve ducts 34 are divided into two sets of six ducts each, each of these sets being associated with a respective one of the sets of cooling fins 32. The second or outer ends of these ducts are arranged alternately with the associated cooling fins 32, as can be seen at the bottom of FIG. 3. The ducts 34 are all air ducts.

The thermal screen 22 captures the heat given off by the motor and the integrated electronic control device 14. The cooling fins 32 and the ducts 34 constitute means for dissipating the heat captured by the screen 22. The cooling fins 32, which are in thermal contact with the remainder of the thermal screen, project into the stream of air generated by the fan rotor 13. They dissipate the heat captured by the screen by transmitting this heat to the stream of air. The ducts 34 enable air to flow in a radial plane, at right angles to the axis 3, between the heated air within the motor and the colder air outside it.

The electronic control device 14 includes two MOSFET power transistors 36, which are connected to the printed circuit board 16 and which are fixed, close to the hoop portion 24 of the screen 22, on the rear face of the thick panel 29. Four of the ducts 34 are formed within the thickness of the thick panel 29, as mentioned above. These transistors are therefore in thermal contact with the panel 29. Facing these transistors, the printed circuit board 16 has a cut-out, so that the transistors do not project beyond the rear face of the printed circuit board 16, as can be seen in FIG. 1. The heat given off by the transistors 36 is passed directly through the panel 29 and dissipated out of the motor through this panel, the fins 32 adjacent to the panel, and the air flowing in the ducts 34 of the panel 29.

The three panels 26, 27 and 28 of the screen are spaced away from the printed circuit board 16 in the axial direction, so as to define a space between these panels and the circuit board, for accommodating the various electronic components carried by the circuit board. Those components which are most susceptible to the effects of heat, and especially logic components, are located on the circuit board in facing relationship to the rear face of the panels 26, 27 and 28, and are thus protected.

The hoop portion 24 of the thermal screen is formed with an internal circular rebate 33 adjacent to its rear face. The printed circuit board 16 is fitted in this rebate 33, which locates the circuit board against radial movement and against forward axial movement i.e. towards the left in FIG. 1. The depth of the rebate 33 in the axial direction is substantially equal to the thickness of the printed circuit board 16, so that that the rear face 18 of the panel lies flush with the rear face of the hoop portion 24.

The printed circuit board 16 is fixed in the thermal screen 22, for which purpose the thermal screen 22 has two fastening lugs 37 which project radially inwards from the hoop portion 24. These fastening lugs 37 are adjacent to the front face 20 of the hoop portion.

Each of the two fastening lugs 37 is flat, and carries on its rear face, facing towards the circuit board 16, means for fastening the printed circuit board 16 to the lugs 37. These fastening means may for example consist of snap-fitting fingers 39 arranged in pairs on each lug 37. With this arrangement, the snap-fitting fingers 39 in each pair are disposed back to back. The printed circuit board then has two apertures through which the respective pairs of fingers 39 pass. In FIG. 3, the fingers 39 are shown in a somewhat diagrammatic form, being represented by hooks.

The printed circuit board 16 has a central circular aperture 38 which contains the commutator 12. The motor has four brushes 40 which are oriented in a radial direction with respect to the axis 3, the brushes being arranged on the front face 20 of the printed circuit board to contact commutator 12. The brushes 40 are mounted in brush cages 42 carried by the printed circuit board 16. The circuit board 16 also carries suppressor components 44 lying on the front face of the board 16. It can thus be seen that the printed circuit board, besides acting as a carrier for the components of the electronic control device, also acts as a brush carrier plate. The panels 26, 27, 28 and 29 of the thermal screen 22 are configured so that the brushes 40 and the suppressor components 44 lie facing the armature 8 without being masked by the panels of the screen, and lie in the plane of the panels, between the screen.

The thermal screen 22 also has three triangular lugs 50 which extend radially from the hoop portion 24 of the screen, to project outside the motor casing. Each lug 50 has a through hole, for fastening the motorized fan to the vehicle. Thus, the whole unit is fastened to the vehicle through the thermal screen 22. After the motor casing has been closed, the cooling fins 32 and the fastening lugs 50 extend between lugs 6, which clip the end plate 4 to the casing shell 2.

The motor, and in particular its electronic control device 14, is connected electrically to the vehicle by means of a single electrical connector, through which the motor is supplied with power and receives the above mentioned datum signal. If required, the electronic control device could be arranged to deliver to the vehicle, via this connector, information as to the functioning of the electric motor. The electric ground of the electronic control device is connected to the mechanical ground of the motor.

The mounting of the integrated electronic control device within the motor casing provides electromagnetic insulation between the interior of the motor and the outside environment. This limits the electromagnetic disturbance of the motor by the environment, and conversely it also limits the electronic disturbance of the environment by the motor.

Numerous modifications could of course be applied to the invention without departing from the scope of the latter. Thus, for example, the form, the number and disposition of the various panels 26 to 29, the cooling fins 32 and the air ducts 34 of the thermal screen may be modified.

Moreover, the fastening of the printed circuit board 16 on the thermal screen 22 could also be obtained by means of screws or rivets or similar fastening devices.

What is claimed is:

1. An electric motor comprising:

a closed motor casing, an armature defining an axis of the motor contained within the closed motor casing, an electric control device contained within the closed motor casing, disposed on the axis and juxtaposed to the armature, and a thermal screen axially interposed between the armature and the electric control device, wherein the thermal screen contacts the electronic control device and comprises:

a plurality of cooling fins projecting outside the casing; and a plurality of ducts, each duct having a first open end within the casing and a second open end on the outside of the casing, wherein at least one of said ducts is interposed between said cooling fins.

2. A motor according to claim 1, wherein a portion of the thermal screen provides an air flow passage between the armature and the electric control device.

3. A motor according to claim 1, wherein the thermal screen further includes at least one panel extending transversely to the axis, the panel interposed between the armature and the electric control device.

4. A motor according to claim 3, wherein the thermal screen has a plurality of panels and a frame carrying the panels, each panel lying in a common transverse plane.

5. A motor according to claim 3, wherein the thermal screen further includes at least one panel extending transversely to the axis, the panel interposed between the armature and the electric control device, wherein at least one of the panels includes at least one panel duct.

6. A motor according to claim 5, wherein the electric control device has a power component facing the panel including the panel duct.

7. A motor according to claim 1, further including a fan rotor for producing a stream of air around the motor, the cooling fins being disposed in a path of the stream of air.

8. A motor according to claim 1, wherein each of the ducts is straight and extends radially within the thermal screen.

9. A motor according to claim 1, wherein the thermal screen is a one-piece metallic component.

10. A motor according to claim 1, wherein the electric control device comprises a printed circuit board connected to the thermal screen and extending perpendicular to the axis.

11. A motor according to claim 10, wherein the thermal screen further includes at least one panel extending transversely to the axis, the panel interposed between the armature and the electric control device, at least one of the panels is positioned away from the printed circuit board, and wherein the electric control device includes a component disposed between at least one of the panels and the printed circuit board.

12. A motor according to claim 11, wherein the motor includes a commutator and a plurality of brushes for engaging the commutator and wherein the printed circuit board has a central aperture and carries the brushes.

13. A motor according to claim 12, wherein the brushes are coplanar with and are positioned between the panels of the thermal screen.

14. A motor according to claim 1, wherein the motor casing comprises a casing shell having an open end and a cover plate secured to the open end, the thermal screen being axially interposed between the casing shell and the cover plate.

15. A motor according to claim 14, wherein the shell includes a terminal edge surrounding the open end and wherein the cover plate includes lugs for fastening the cover plate on the terminal edge.

16. A motorized fan for a motor vehicle comprising the thermal screen of claim 1.

17. A fan according to claim 16, wherein the thermal screen includes fastening lugs projecting outside the motor casing, each of the fastening lugs having a through hole for fastening the fan to the vehicle.

* * * * *